United States Patent
Pharand

(10) Patent No.: US 9,111,793 B2
(45) Date of Patent: Aug. 18, 2015

(54) JOINING A CHIP TO A SUBSTRATE WITH SOLDER ALLOYS HAVING DIFFERENT REFLOW TEMPERATURES

(71) Applicant: International Business Machines Corporation, Armonk, NY (US)

(72) Inventor: Sylvain Pharand, Quebec (CA)

(73) Assignee: International Business Machines Corporation, Armonk, NY (US)

(*) Notice: Subject to any disclaimer, the term of this patent is extended or adjusted under 35 U.S.C. 154(b) by 79 days.

(21) Appl. No.: 14/013,182

(22) Filed: Aug. 29, 2013

(65) Prior Publication Data

US 2015/0061158 A1 Mar. 5, 2015

(51) Int. Cl.
 *H01L 23/00* (2006.01)
(52) U.S. Cl.
 CPC ............. *H01L 24/11* (2013.01); *H01L 24/17* (2013.01)
(58) Field of Classification Search
 CPC ................................. H01L 24/14; H01L 24/17
 See application file for complete search history.

(56) References Cited

U.S. PATENT DOCUMENTS

| | | | |
|---|---|---|---|
| 5,598,036 A * | 1/1997 | Ho | 257/738 |
| 6,224,690 B1 | 5/2001 | Andricacos et al. | |
| 6,596,621 B1 | 7/2003 | Copeland et al. | |
| 6,916,185 B2 * | 7/2005 | Hedler et al. | 439/83 |
| 7,038,144 B2 * | 5/2006 | Yasuda et al. | 174/260 |
| 8,197,612 B2 | 6/2012 | Busby et al. | |
| 8,212,357 B2 | 7/2012 | Daubenspeck et al. | |
| 2003/0155408 A1 | 8/2003 | Fanti et al. | |
| 2005/0104208 A1 | 5/2005 | Bartelo et al. | |
| 2012/0119363 A1 | 5/2012 | Farooq | |
| 2012/0187558 A1 | 7/2012 | Arvin et al. | |
| 2012/0248604 A1 | 10/2012 | Daubenspeck et al. | |

OTHER PUBLICATIONS

Zhuqing Zhang et al., "Recent Advances in Flip-Chip Underfill: Materials, Process, and Reliability", IEEE Transactions on Advanced Packaging, vol. 27, No. 3, Aug. 2004, pp. 515-524.

* cited by examiner

*Primary Examiner* — Thanh V Pham
(74) *Attorney, Agent, or Firm* — L. Jeffrey Kelly; H. Daniel Schnurmann

(57) ABSTRACT

A method including identifying a first connection location on a chip having a first connection type and a second connection location on the chip having a second connection type, applying a first solder alloy to the first connection location, heating the first solder alloy to a temperature sufficient to cause the first solder alloy to reflow, applying a second solder alloy to the second connection location, and heating the second solder alloy to a temperature sufficient to cause the second solder alloy to reflow.

8 Claims, 7 Drawing Sheets

JOINING A CHIP TO A SUBSTRATE WITH SOLDER ALLOYS HAVING DIFFERENT REFLOW TEMPERATURES

BACKGROUND

The present invention generally relates to packaging integrated circuits, and more particularly to joining a chip to a substrate with two or more different solder alloys.

A semiconductor chip may be joined to a substrate (also known as a composite substrate, a laminate substrate, or an organic laminate substrate) using a plurality of solder connections to form a semiconductor package.

An example of the solder connection includes controlled collapse chip connection (also known as C4 or flip-chip connection). Generally, solder connections may generally include an array of small solder balls on the surface of the chip before the chip is joined to the substrate. More specifically, each individual solder connection may include a bonding pad on the chip, a solder bump, and a corresponding bonding pad on the substrate. A typical joining sequence may begin with depositing or applying a plurality of solder bumps on a plurality of bonding pads on the chip. The plurality of solder bumps are then heated to a temperature sufficient to cause them to reflow. Next, the chip, including the plurality of solder bumps, is aligned to and placed on a chip site on the substrate. In doing so, the plurality of solder bumps contact the plurality of bonding pads on the substrate. The plurality of solder bumps are again heated to a temperature sufficient to cause them to reflow. The final solder connections may electrically connect and physically join the chip to the substrate and create a semiconductor package.

The primary function of the solder connection is to electrically connect and physically join a chip to a substrate. Further, each individual solder connection may serve a different electrical function, or may form a different type of solder connection. For example, some solder connections may be used for grounding or to supply higher current voltages and subsequently form a voltage connection between the chip and the substrate, while other solder connections may be used to transmit signal data and subsequently form a signal connection between the chip and the substrate. In general, the signal connections may experience relatively low current density under normal operating conditions and the voltage connections may experience relatively high current density under normal operating conditions. Power transfer and signal transmission may be examples of specific operational requirements of a particular solder connection.

Typical solder connections use a lead-tin (Pb/Sn) solder with high lead content of 95% or more, by weight. The tin content is kept to a minimum, usually less than 5%, by weight, because tin may undesirably react with the copper and form undesirable intermetallics. The higher the tin content, the more the solder reacts with the copper. Consequently, there may also be a nickel (Ni) or cobalt (Co) barrier layer to either protect the copper layer from being consumed by the solder or to protect various layers underneath the copper layer.

Solder alloys containing lead are now recognized as being harmful to the environment, and there is a considerable interest in using lead-free solder alloys. For example, two commercially-available lead-free solder alloys include tin-silver (Sn/Ag) and tin-silver-copper (Sn/Ag/Cu). Current technologies rely on a single solder alloy to form all the solder connections used to join a chip to a substrate. For example, all the solder connections between the chip and the substrate may include a tin-silver-copper solder alloy having a silver content of 1.4%, by weight, and a copper concentration of 0.5%, by weight.

SUMMARY

According to one embodiment of the present invention, a method is provided that may include forming a first solder bump on a chip, the first solder bump made of a first alloy, and forming a second solder bump on a chip, the second solder bump made of a second alloy, wherein the first alloy has a different alloy concentration and is different from the second alloy.

According to another embodiment, a method is provided that may include identifying a first connection location on a chip having a first connection type and a second connection location on a chip having a second connection type, applying a first solder alloy to the first connection location, and heating the first solder alloy to a temperature sufficient to cause the first solder alloy to reflow. The method may further include applying a second solder alloy to the second connection location, and heating the second solder alloy to a temperature sufficient to cause the second solder alloy to reflow.

According to another embodiment, a structure is provided that may include a first solder connection between a substrate and a chip, the first solder connection made of a first alloy, and a second solder connection between the substrate and the chip, the second solder connection made of a second alloy, where the first alloy has a different alloy concentration than the second alloy.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
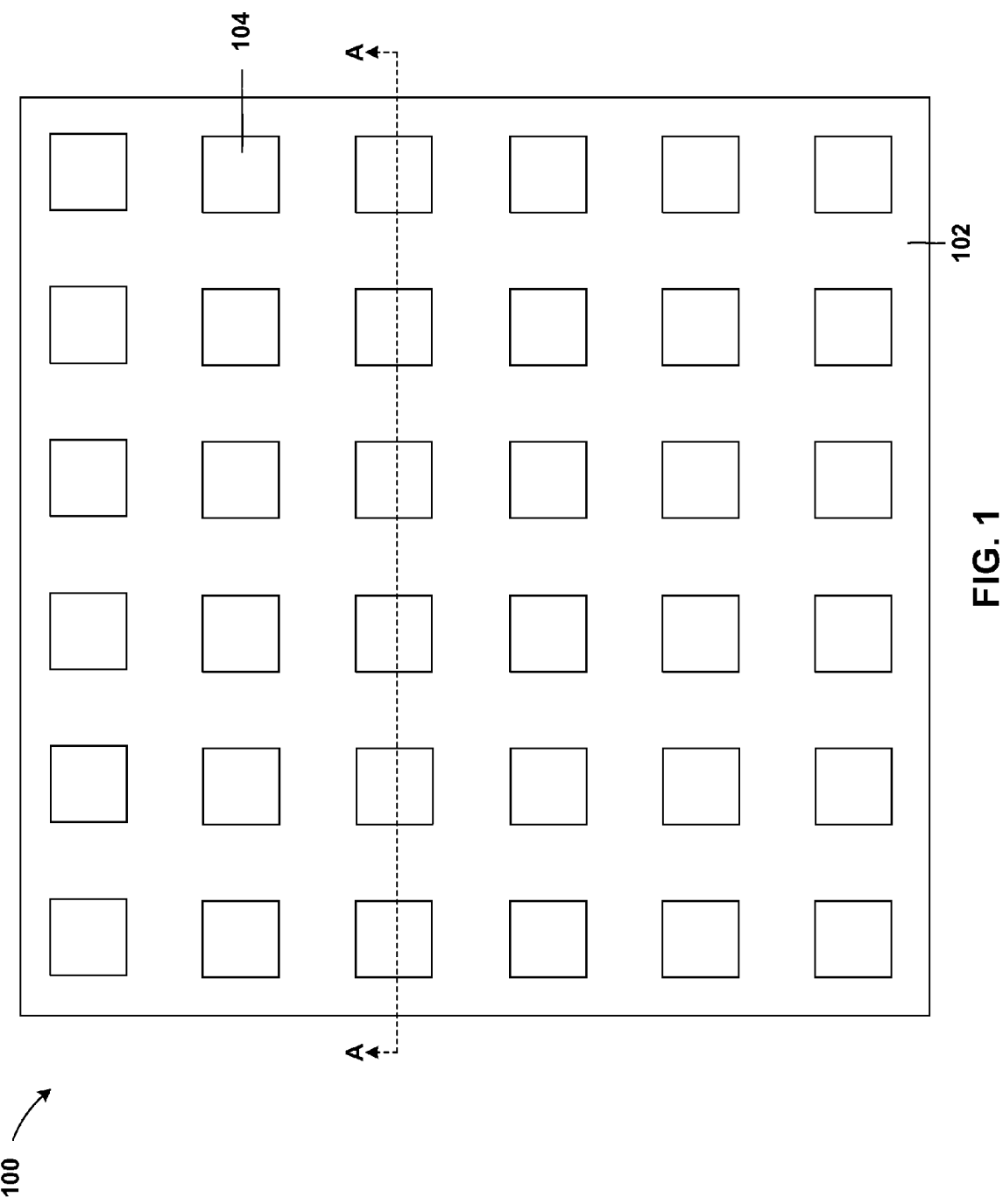
FIG. 1 is a top view of a chip according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention generally relates to packaging integrated circuits, and more particularly to joining a chip to a substrate with two or more different solder alloys. One embodiment of the present invention may include selectively depositing different solder alloys based on the electrical function or connection type of each solder connection.

It should be noted that a solder alloy, as used in the following description, may refer to any mixture of two or more elements that which may be used to join together metal work pieces and having a melting temperature less than the melting temperature of the work piece. It should also be noted that different alloys, as used in the following description, may refer to two alloys having different combinations of elements, such as, for example, tin-silver (Sn/Ag) and tin-silver-copper (Sn/Ag/Cu). Different alloys may also refer to two alloys having the same combination of elements, but in different concentrations, such as, for example, tin-silver-copper (Sn/Ag/Cu) having a silver content of about 1.4%, by weight, and tin-silver-copper (Sn/Ag/Cu) having a silver content of about 2%, by weight.

Use of lead-free solder alternatives, such as those previously described, have presented reliability, yield, and performance challenges. More specifically, issues of electromigration and cracking are of particular concern. Generally, solder connections which may experience high current density may be susceptible to electromigration failure. Furthermore, thermal expansion and contraction of the semiconductor package during fabrication and normal operation may produce stress cracks and lead to a connection failure.

One way to improve reliability, yield and performance may include improving electromigration resistance and reducing the possibility of cracking. One way to address issues of stress and cracking while also improving electromigration resistance may include joining a chip to a substrate with an array of solder connections, each having a different solder alloy selected to address the operational requirements of each corresponding solder connection. One embodiment by which to address issues of stress and cracking while also improving electromigration performance is described in detail below by referring to the accompanying drawings FIGS. 1-7. In the present embodiment, the solder alloy used to form a solder connection designed to experience high current density, for example a voltage connection, may be different from a solder connection designed to experience low current density, for example a signal connection.

Referring now to FIG. 1, a chip 102 is shown. The chip 102 may alternatively be referred to as a die, an integrated circuit (IC), or a microchip. The chip 102 may include a first plurality of bonding pads 104 (hereinafter "first bonding pads") located in a bottom surface of the chip 102. The first bonding pads 104 may be used to electrical connect and physically join the chip 102 to a substrate forming a semiconductor package. In the present embodiment, a plurality of solder bumps (hereinafter "solder bumps") may be deposited on or applied to the first bonding pads 104. A portion of the solder bumps may include a first alloy 110 and another portion of the solder bumps may include a second alloy 112. In one embodiment, the solder bumps may include at least, but not limited to , the first and second solder alloys 110, 112. The solder bumps may subsequently form a plurality of solder connections (hereinafter "solder connections") between the chip 102 and a substrate. The solder connections may include any known solder connection used to electrically connect and physically join the chip 102 to a substrate, such as, for example, a C4 connection, as previously described. As such, the first bonding pads 104 may represent a solder connection location, or alternatively a C4 location.

Figure 2:
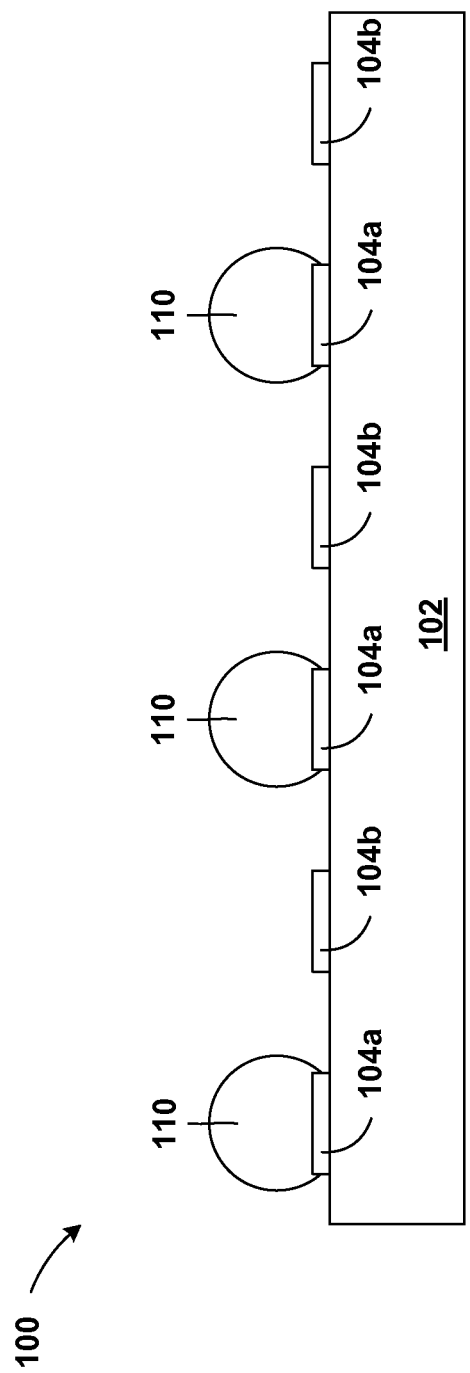
FIG. 2 is cross section view of FIG. 1 illustrating the selective solder deposition of a first solder alloy according to an exemplary embodiment.

Referring now to FIG. 2, a cross section view of FIG. 1 along section line A-A, is shown. A first solder alloy 110 may be deposited or applied to some, but not all, of the first bonding pads 104. Before depositing the first solder alloy 110, each of the first bonding pads 104 may be identified by function or connection type. The primary function of the first bonding pads 104 is to facilitate the formation of a solder connection (e.g. C4) used to electrically connect and physically join a chip to the substrate 102. Further, each individual bonding pad (104) may serve a different electrical function, or may be used to form a different type of solder connection. For example, some of the first bonding pads (104a) may be used for grounding or to supply higher current voltages and subsequently form a voltage connection between the chip 102 and the a substrate, while some of the first bonding pads (104b) may be used to transmit signal data and subsequently form a signal connection between the chip 102 and a substrate. In general, the signal connections may experience relatively low current density under normal operating conditions, and the voltage connections may experience relatively high current density under normal operating conditions. As such, the voltage connections may experience relatively higher current density than the signal connections.

In one embodiment, the first solder alloy 110 may be selectively deposited only on the first bonding pads 104a intended to form a voltage connection. In the present embodiment, the first solder alloy 110 may be chosen specifically to address the operational requirements of a voltage connection and similarly a relatively high current density, as described in more detail below. Any known solder deposition technique be used to deposit the first solder alloy 110 such as, for example, a screen soldering technique, or a ball drop technique. In the present embodiment, a first stencil mask may be used to prevent the first solder alloy 110 from being applied to the first bonding pads (104b) not intended to for a voltage connection.

Next, the structure 100 may be heated to a temperature sufficient to cause the first solder alloy 110 to reflow. Any known technique may be used to heat the structure 100 and cause the first solder alloy 110 to reflow. In one embodiment, a typical reflow oven can use a controlled time-temperature profile to heat the structure 100 and cause the first solder alloy 110 to reflow. The reflow oven can include heating elements, for example infrared heating elements, to provide the required heat. Generally, a temperature above the reflow temperature of the solder alloy is used to ensure complete reflow. In one embodiment, a temperature ranging from about 218° C. to about 260° C. can be applied to cause the first solder alloy 110 to reflow.

Figure 3:
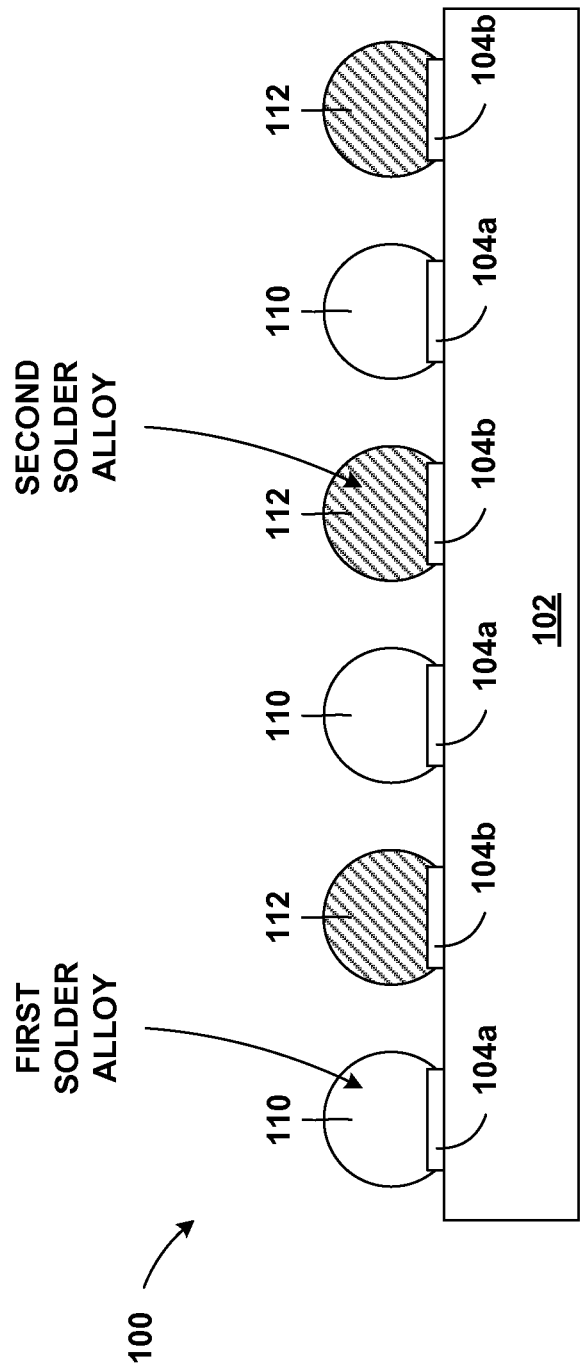
FIG. 3 is cross section view of FIG. 1 illustrating the selective solder deposition of a second solder alloy according to an exemplary embodiment.

Referring now to FIG. 3, a second solder alloy 112 be deposited or applied to some, but not all, of the first bonding pads 104. The first bonding pads 104 may be identified by connection type, as previously described.

In one embodiment, the second solder alloy 112 may be selectively deposited only on the first bonding pads 104b intended to form a signal connection. In one embodiment, the second solder alloy 112 may be chosen specifically to address the operational requirements of the signal connection and similarly a relatively low current density, as described in more detail below. Any solder deposition technique known in the art may be used to deposit the second solder alloy 112 such as, for example, a screen soldering technique, or a ball drop technique. In the present embodiment, a second stencil mask may be used to prevent the second solder alloy 112 from being applied to the first bonding pads (104a) not intended to for a signal connection.

Next, the structure 100 may be heated, again, to a temperature sufficient to cause the second solder alloy 112 to reflow. Similar techniques as previously described may be used to cause the second solder alloy 112 to reflow. Heating the structure 100 again may cause the first solder alloy 110 may also reflow again.

The first solder alloy 110 and the second solder alloy 112 may be different alloys, and may each include any conceivable solder alloy. For example, any lead-free solder alloy may be used. More specifically, as previously described, the first solder alloy 110 may be used to form a voltage connection, and the second solder alloy 112 may be used to form a signal connection. Therefore, the first solder alloy 110 and the second solder alloy 112 may each be tailored to address the operational requirements of each corresponding solder connection, for example, a voltage connection and a signal connection. In one embodiment, the first solder alloy 110 and the second solder alloy 112 may include at least one common element.

Figure 4:
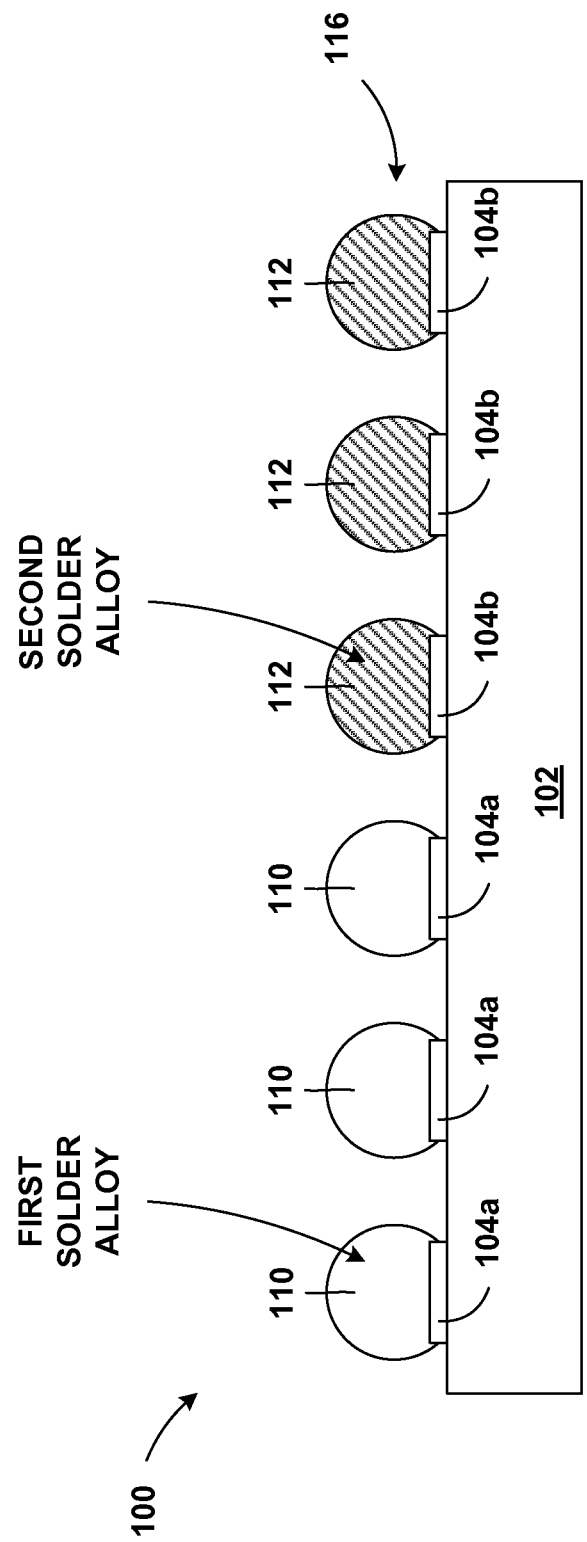
FIG. 4 is cross section view of FIG. 1 illustrating an alternative embodiment after selectively depositing the first and second solder alloys.
Figure 5:
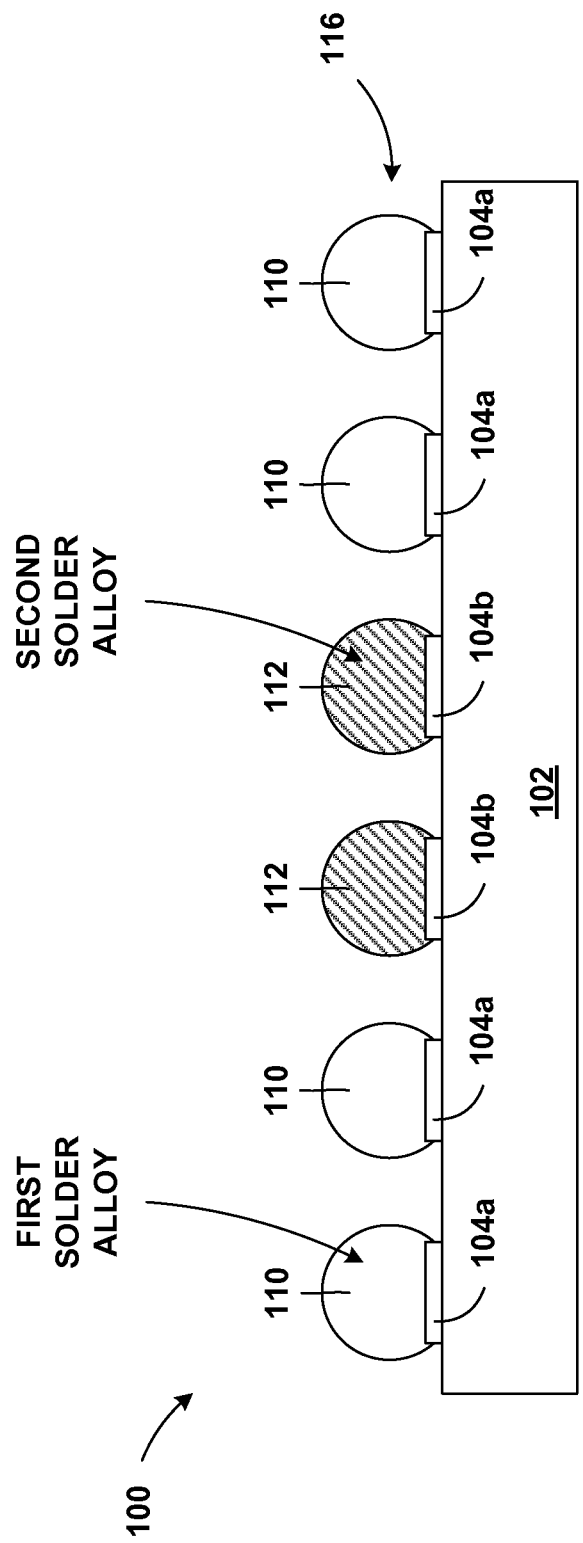
FIG. 5 is cross section view of FIG. 1 illustrating an alternative embodiment after selectively depositing the first and second solder alloys.

Referring now to FIGS. 4 and 5, alternative deposition configurations are shown. Because the first and second solder alloys 110, 11 are deposited base on connection type, they can potentially be positioned anywhere on the chip. Stated differently, the voltage connections and the signal connection can be located anywhere on the chip 102. It should be noted that an alternating configuration as illustrated in FIG. 3 is not require and is provided merely for illustrative purposes.

Figure 6:
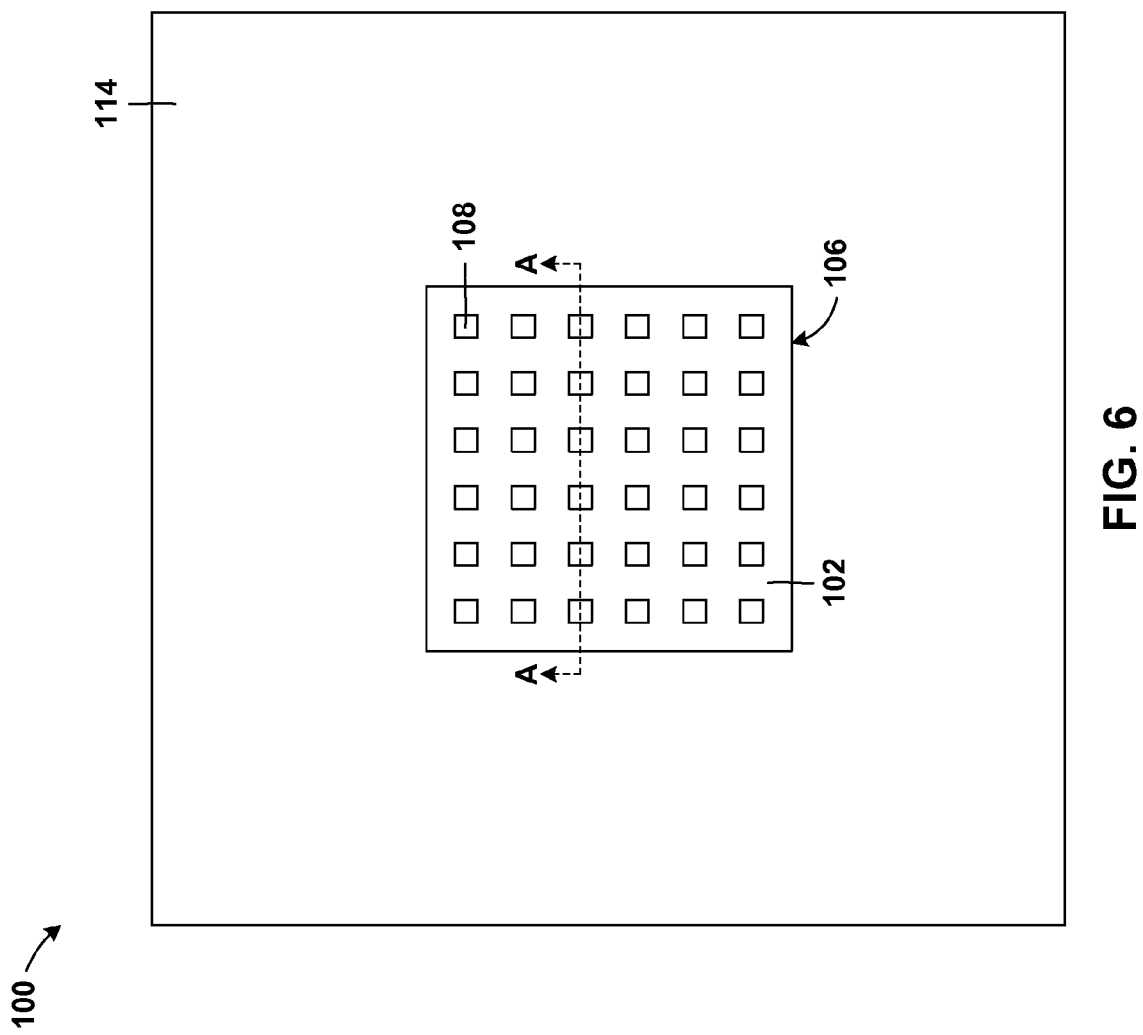
FIG. 6 is a top view of a substrate according to an exemplary embodiment.

Referring now to FIG. 6, a substrate 114 is shown. The substrate may include a chip site 106 having a second plurality of bonding pads 108 (hereinafter "second bonding pads"). It should be noted that the second bonding pads 108 of the substrate 114 may be substantially similar to the bonding pads 104 of the chip 102, as previously described.

Figure 7:
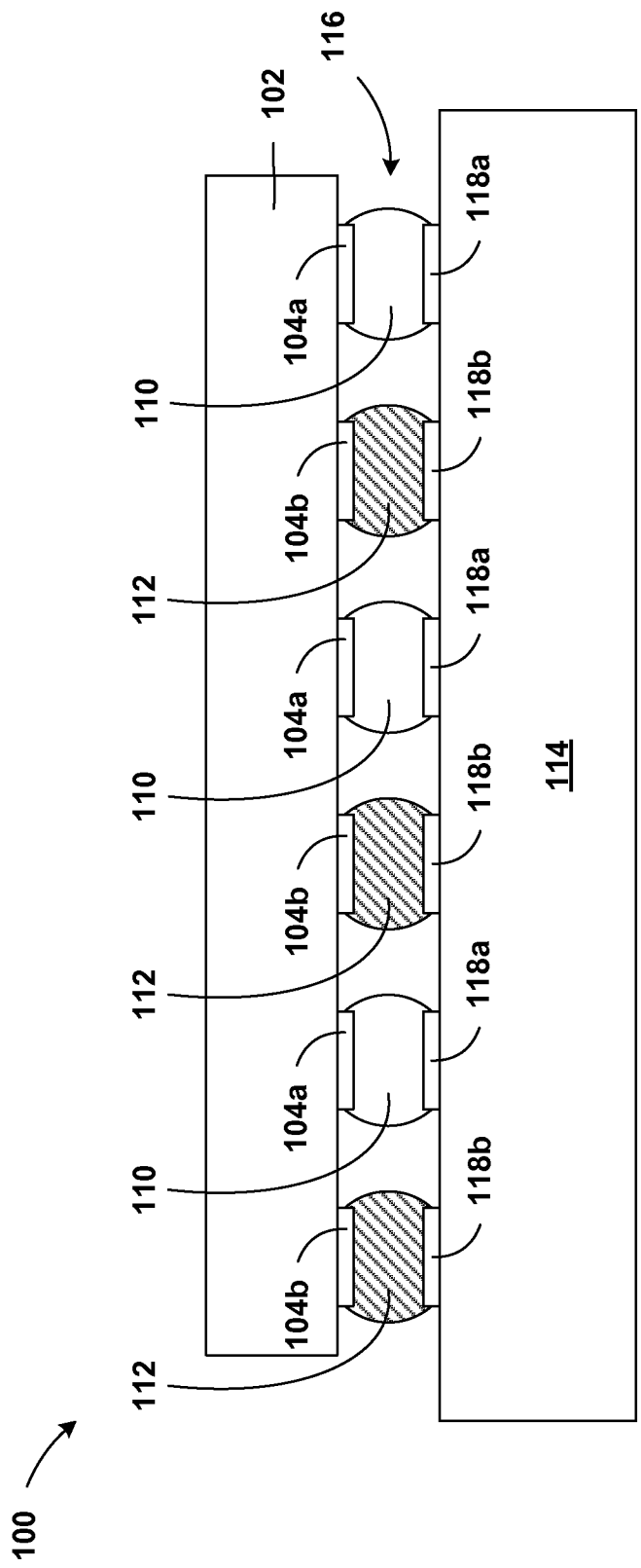
FIG. 7 is cross section view of FIG. 1 illustrating a final structure according to an exemplary embodiment.

Now referring to FIG. 7, the chip 102, including the first solder alloy 110 and the second solder alloy 112, may be placed on top of the substrate 114. The chip 102 may be positioned within the chip site 106 such that the solder bumps of the chip 102, including the first and second solder alloys 110, 112, align with and contact the second bonding pads 108 of the substrate 114.

The structure 100 may be heated, again, to a temperature sufficient to cause both the first and second solder alloys 110, 112 to reflow and form a plurality of solder connections 116. Similar techniques as previously described may be used to heat the structure 100. The solder connections 116 may electrically connect and physically join the chip 102 to the substrate 114.

The performance and reliability of the entire structure 100 may be improved by matching a particular solder alloy to the connection type of each solder connection. It should be noted that while only two solder alloys corresponding to two different operational requirements are illustrated in the figures and discussed herein, this disclosure may equally apply to any number of solder alloys corresponding to any number different types of connections.

In one embodiment, for example, the first solder alloy 110 and the second solder alloy 112 may both include a lead-free solder made of tin, silver, and copper. Increasing the silver concentration, in the present case, has been shown to improve electromigration reliability, but deteriorate structural integrity by making the alloy stiffer and more susceptible to cracking. Conversely, decreasing the silver concentration has been shown to improve structural integrity by making the alloy more ductile and less susceptible to cracking, but deteriorate electromigration reliability. Therefore, the performance and reliability of the entire structure 100 may be improved by adjusting the silver content of the solder alloy to suit the needs of each solder connection.

Therefore, a solder alloy having a relatively higher concentration of silver may be used to address concerns of electromigration failure. Conversely, a solder alloy having relatively a lower concentration of silver may be used to address concerns of cracking. More specifically, a higher silver concentration may be used in solder connections which may experience relatively high current density, and a lower silver concentration may be used in solder connections which may experience relatively low current density.

Not all solder connections joining a chip to a substrate may benefit from either of the advantages described above. In fact, some solder connections, for example, solder connections which may experience higher current density may benefit from improved electromigration performance. On the contrary, some solder connections, for example, solder connections which may experience lower current density may benefit from being stiffer to prevent damage or cracking.

In one embodiment, the solder connections formed with the first solder alloy 110 may have a different silver content than the solder connections formed with the second solder alloy 112. More specifically, the solder connections formed with the first solder alloy 110 may have a silver content of about 2%, by weight, and the solder connections formed with the second solder alloy 112 may have a silver content of about 1.4%, by weight, or less.

The various embodiments described above offer distinct advantages and improve the performance and reliability of an entire semiconductor packing in which a chip is electrically connected and physically joined to a substrate using a plurality of solder connections. For example, different solder alloys may be used to improve the performance and reliability of specific solder connections based on their function. Similarly, the performance and reliability of a solder connection having one function may be improved without deteriorating the performance and reliability of another solder connection having a different function. These advantages may be further realized when using a lead-free solder.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:
1. A method comprising:
    identifying a first connection location on a chip having a first connection type and a second connection location on the chip having a second connection type;
    applying a first solder alloy to the first connection location;
    heating the first solder alloy to a temperature sufficient to cause the first solder alloy to reflow;
    applying a second solder alloy to the second connection location; and heating the second solder alloy to a temperature sufficient to cause the second solder alloy to reflow.

2. The method of claim 1, wherein applying a first solder alloy to the first connection location, and applying a second solder alloy to the second connection location comprise:

using a screen soldering technique in which a first stencil mask is used to prevent the first solder alloy from being applied to the second connection locations, and a second stencil mask is used to prevent the second solder alloy from being applied to the first connection locations.

3. The method of claim 1, wherein the first connection type comprises an electrical function having high current density, and the second connection type comprises an electrical function having low current density.

4. The method of claim 1, wherein the first solder alloy and the second solder alloy comprise the same elements, wherein at least one of the same elements has a different concentration in the first solder alloy than in the second solder alloy.

5. The method of claim 1, wherein the first solder alloy and the second solder alloy comprise copper, silver, and tin, the first solder alloy having a different silver concentration than the second solder alloy.

6. The method of claim 1, wherein the first solder alloy and the second solder alloy each comprise silver, the first solder alloy having a different silver concentration than the second solder alloy.

7. The method of claim 1, wherein applying a first solder alloy to the first connection location, and applying a second solder alloy to the second connection location comprise:

using a ball drop technique in which a first stencil mask is used to prevent the first solder alloy from being applied to the second connection location, and a second stencil mask is used to prevent the second solder alloy from being applied to the first connection location.

8. The method of claim 1, further comprising:

identifying a third connection location on a substrate having a third function;

applying a third solder alloy to the third connection location; and heating the third solder alloy to a temperature sufficient to cause the third solder alloy to reflow.

\* \* \* \* \*